United States Patent
Govoreanu et al.

(10) Patent No.: US 9,786,795 B2
(45) Date of Patent: Oct. 10, 2017

(54) SELECTOR FOR RRAM

(71) Applicants: IMEC VZW, Leuven (BE); Katholieke Universiteit Leuven, Leuven (BE)

(72) Inventors: Bogdan Govoreanu, Hulshout (BE); Christoph Adelmann, Wilsele (BE); Leqi Zhang, Heverlee (BE); Malgorzata Jurczak, Leuven (BE)

(73) Assignees: IMEC VZW, Leuven (BE); Katholieke Universiteit Leuven, Leuven (BE)

( * ) Notice: Subject to any disclaimer, the term of this patent is extended or adjusted under 35 U.S.C. 154(b) by 0 days.

(21) Appl. No.: 14/508,906

(22) Filed: Oct. 7, 2014

(65) Prior Publication Data
US 2015/0097187 A1  Apr. 9, 2015

(30) Foreign Application Priority Data
Oct. 7, 2013 (EP) .................................... 13187621

(51) Int. Cl.
*H01L 29/861* (2006.01)
*H01L 29/16* (2006.01)
(Continued)

(52) U.S. Cl.
CPC ........ *H01L 29/861* (2013.01); *H01L 27/2418* (2013.01); *H01L 29/16* (2013.01);
(Continued)

(58) Field of Classification Search
CPC .............................................. H01L 27/11543
See application file for complete search history.

(56) References Cited

U.S. PATENT DOCUMENTS 3,275,905 A * 9/1966 Pollack ........................... 257/38
3,370,978 A * 2/1968 Morris et al. ................. 427/125
(Continued)

FOREIGN PATENT DOCUMENTS

WO    WO 01/24186 A1    4/2001

OTHER PUBLICATIONS

European Search Report dated Feb. 20, 2014 in European Application No. 13187621.1.
(Continued)

*Primary Examiner* — Eugene Lee
(74) *Attorney, Agent, or Firm* — Knobbe, Martens, Olson & Bear LLP

(57) ABSTRACT

The disclosed technology generally relates to semiconductor devices and more particularly to selector devices for memory devices having a resistance switching element, particularly resistive random access memory (RRAM) devices. In one aspect, a selector device includes a first barrier structure comprising a first metal and a first semiconductor or a first low bandgap dielectric material, and a second barrier structure comprising a second metal and a second semiconductor or a second low bandgap dielectric material. The selector device additionally includes an insulator interposed between the first semiconductor or the first low bandgap dielectric material and the second semiconductor or the second low bandgap dielectric material. The first barrier structure, the insulator, and the second barrier structure are stacked to form a metal/semiconductor or low bandgap dielectric/insulator/semiconductor or low bandgap dielectric/metal structure.

18 Claims, 5 Drawing Sheets

(51) Int. Cl.
    *H01L 29/45*     (2006.01)
    *H01L 45/00*     (2006.01)
    *H01L 29/88*     (2006.01)
    *H01L 27/24*     (2006.01)

(52) U.S. Cl.
    CPC ........ *H01L 29/1604* (2013.01); *H01L 29/456* (2013.01); *H01L 29/88* (2013.01); *H01L 45/00* (2013.01)

(56) References Cited

U.S. PATENT DOCUMENTS

| | | | |
|---|---|---|---|
| 5,413,958 A * | 5/1995 | Imahashi | C23C 16/24 148/DIG. 150 |
| 6,303,942 B1 * | 10/2001 | Farmer, II | 257/30 |
| 7,220,983 B2 * | 5/2007 | Lung | 257/4 |
| 8,008,162 B2 * | 8/2011 | Srinivasan et al. | 438/397 |
| 8,866,121 B2 * | 10/2014 | Wang et al. | 257/4 |
| 9,153,597 B2 * | 10/2015 | Kim et al. | |
| 2003/0160557 A1 * | 8/2003 | Chen et al. | 313/310 |
| 2004/0201010 A1 * | 10/2004 | Ugajin | 257/25 |
| 2010/0315857 A1 | 12/2010 | Sonehara et al. | |
| 2011/0062485 A1 * | 3/2011 | Nakayama | H01L 33/42 257/99 |
| 2011/0127484 A1 | 6/2011 | Yasutake | |
| 2011/0147942 A1 | 6/2011 | Yahashi et al. | |
| 2012/0267632 A1 * | 10/2012 | Ramaswamy et al. | 257/62 |
| 2012/0298999 A1 * | 11/2012 | Jinbo | H01L 29/04 257/57 |
| 2013/0291933 A1 * | 11/2013 | Kupich | H01L 31/075 136/255 |

OTHER PUBLICATIONS

Govoreanu et al., "A model for tunneling current in multi-layer tunnel dielectrics," *Solid-State Electronics*, vol. 47, pp. 1045-1053 (2003).

"Heterojunction", downloaded from https://en.wikipedia.org/wiki/Heterojunction on Apr. 7, 2017; 8 pages.

* cited by examiner

SELECTOR FOR RRAM

CROSS-REFERENCE TO RELATED APPLICATIONS

This application claims foreign priority to European patent application EP 13187621.1 filed on Oct. 7, 2013, the content of which is incorporated by reference herein in its entirety.

BACKGROUND OF THE INVENTION

Field of the Invention

The disclosed technology generally relates to semiconductor devices and more particularly to selector devices for memory cells having a resistance switching element.

Description of the Related Technology

Resistive random access memory (RRAM) technology is a promising non-volatile memory technology candidate to potentially succeed flash memory technology, due to its simple structure and a potential for low-power operation. Recently, RRAM technologies having resistive memory cells arranged in "cross-bar" configurations have attracted considerable attention due to their potential for high bit-density integration. Memory arrays having cross-bar architectures, sometimes called "cross-bar arrays" or "cross-point arrays," have a first plurality of conductive lines (e.g., bit lines) and a second plurality of conductive lines (e.g., wordlines) that cross the first conductive lines, and a plurality of memory cells formed at intersections of the first and second conductive lines. The memory cells include a resistive switching element that can switch between a high resistance state and a low resistance state in response to a current signal or a voltage signal. Despite the promising attributes, several technological challenges have been identified in implementing resistive memory devices having cross-bar architectures, including suppressing leakage currents through unselected/inhibited cells and delivering high drive currents through selected target cells during operation of the cross-bar arrays.

Leakage current paths formed through unselected memory cells during operation of the cross-bar arrays are referred to in the industry as "sneak current paths." During operation of a cross-bar array, when addressing a selected target selected memory cell, parasitic current can flow through the sneak current paths formed through unselected memory cells that are in low resistance states. Such leakage currents can reduce the signal to noise ratio in reading the selected memory cell, which can in turn increase the rate of error in reading. The sneak path problem can be more pronounced in in passive arrays, especially situations where the low resistive state of the memory cell exhibits linear, or nearly linear current-voltage (IV) characteristics. Such linear or nearly linear I-V characteristics can result in a low signal-to-noise ratio, and can lead to a cell being misread due to the parasitic sneak current path via low resistance state neighbours.

To reduce the leakage currents through the unselected memory cells during operation, some cross-bar arrays employ selector devices. The selector devices can be two-terminal devices such as diodes, or three-terminal devices such as transistors. While selector devices can be effective in reducing leakage currents when included in the cross-bar arrays, some selector devices, especially three-terminal devices such as transistors, can take up greater lateral foot print compared to the resistance switching element, thereby limiting the physical bit-density of the memory array.

Achieving a high bit-density in memory technologies is technologically and economically desirable for practical implementations of resistive memory technologies.

Various 2-terminal structures such as diodes (e.g. Schottky diodes, Zener diodes or tunnel diodes) or volatile switches (e.g. threshold switches, Mott switches, MIEC access devices) have been proposed as selectors for unipolar and bipolar RRAMs. Semiconducting materials and/or novel materials are used to build such diodes.

Two relatively important considerations in choosing a selector, in terms of the performance of a RRAM device, can be the drive current and the non-linearity factor. To be able to program and erase some resistive switching elements, selectors should be capable of delivering a high drive current. For example, to switch a resistive switching element having a lateral dimension of 10 nm×10 nm with a current of 1 uA switching current, a selector needs to supply at least 1 $MA/cm^2$. In addition, the non-linearity factor (or rectification factor or on/off ratio), which can be defined as a ratio between the current thorough the selector at a switching voltage and the current through the selector at half the switching voltage, should be at least 1000, for example, to enable relatively large memory arrays, e.g., memory arrays exceeding 1 Mbit in size. Available two terminal selector options fall short of desirable performances with respect to one or both of the drive current and the non-linearity factor considerations. Other selector options employ materials that are very difficult to integrate using conventional CMOS process technologies, such as platinum. Therefore, there is a need for a two-terminal selector device that can deliver both high drive current and high non-linearity factor, which can also be fabricated using CMOS-compatible process technologies.

SUMMARY OF CERTAIN INVENTIVE ASPECTS

The above objective is accomplished by a method and device according to the present invention.

In a first aspect, the present invention provides a system for use as a selector in RRAM arrays. The system comprises a first metalsemiconductor or low bandgap dielectric structure and a second metal/semiconductor or low bandgap dielectric structure, and an insulator. The insulator is located in between the first metal/semiconductor or low bandgap dielectric structure and the second metal/semiconductor or low bandgap dielectric structure. The first and second metal/semiconductor or low bandgap dielectric structures are oriented back to back resulting in a metal/semiconductor or low bandgap dielectric/insulator/semiconductor or low bandgap dielectric/metal structure.

It is an advantage of embodiments of the present disclosure that both a high drive current and a high non-linearity factor can be obtained by breaking the typical trade-offs of existing structures. It is an advantage of embodiments of the present disclosure that the drive current and non-linearity factor can be tuned in a much less interdependent way than in prior art structures. It is an advantage of embodiments of the present disclosure that the unique combination between a variable barrier charge injector and an oxide layer enables decoupling the high-drive current versus non-linearity factor trade-off. The metal/semiconductor or low bandgap dielectric structure can be selected so as to provide a high tunnelling current, by providing a relatively low M/S barrier height, e.g. below 1 eV. This may be advantageously obtained by providing the semiconductor or low bandgap dielectric layer of only a few nm thick. In embodiments of the present disclosure the semiconductor in the metalsemiconductor structure may be replaced by a dielectric with low bandgap, the bandgap of the dielectric being below 6 eV, preferably below 4 eV, such that the metal/low-bandgap dielectric electron barrier height is below 2 eV, and preferably between 0.4 eV and 1 eV. The insulator is located in between the metalsemiconductor (or low bandgap dielectric) structures. It is an advantage of embodiments of the present disclosure that the insulator provides an enhanced non-linearity factor in the selector operation. It is an advantage of embodiments of the present disclosure that the system can be implemented with plain Si-technology available/compatible materials.

In a system according to embodiments of the present invention, the metal of the first metal/semiconductor or low bandgap dielectric structure may be a metallic compound and/or the metal of the second metalsemiconductor or low bandgap dielectric structure may be a metallic compound.

It is an advantage of embodiments of the present disclosure that the metal/semiconductor (or low bandgap dielectric) barrier height can be controlled through metal (metallic compound) workfunction modification. In exemplary embodiments of the present disclosure, TiAlN may be used to modify (reduce) the TiN workfunction. In such embodiments the workfunction change can be as large as 0.5 eV. This produces important changes in tunnelling current, especially when the relative change of the metal/semiconductor (or low bandgap dielectric) barrier height is large. It is an advantage that such a metallic compound/semiconductor or low bandgap dielectric injector can provide a high tunnelling current. In embodiments of the present disclosure it is advantageous if the semiconductor layer is only a few nm thin.

In a system according to embodiments of the present invention, the semiconductor layer may comprise silicon, for instance amorphous silicon. Silicon, and in particular amorphous silicon, is CMOS-friendly, it allows back-end-of-the-line (BEOL)-compatible processes to be used, it can be deposited with a low thermal budget, and it is commonly available.

In embodiments of the present invention, the insulator may comprise a stack of thin dielectrics. It is an advantage of embodiments of the present disclosure that additional outer layers may be added to a core dielectric layer, for meeting specific functions. In an exemplary embodiment of the present disclosure the function of the stack of thin dielectrics may be to facilitate the deposition/growth of the main barrier oxide which is the insulating layer.

In embodiments of the present invention, the insulator may comprise a Si-rich SiN, or a N-doped Si layer. It is an advantage of such embodiments of the present disclosure that the whole barrier modulation may be achieved through a Si-based material, which provides manufacturing advantages. It is a further advantage that the insulator layer can for example be deposited through a chemical vapour deposition type of process, which is an easy and well-known process.

In a system according to embodiments of the present invention, the metal of the first metalsemiconductor or low bandgap dielectric structure may be TiN and the metal of the second metalsemiconductor or low bandgap dielectric structure may be TiN, the semiconductor may be a-Si, and the insulator may be any of $Ta_2O_5$ or $AlTaO_x$, or $TaSiO_x$.

In a second aspect, the present invention provides the use of a system according to any of the embodiments of the first aspect as a selector in an RRAM array.

It is an advantage of embodiments of the present disclosure that integrable CMOS materials may be used to form an appropriate selector for an RRAM array. It is an advantage of embodiments of the present disclosure that the drive current and the non-linearity factor of the selector according to embodiments of the present invention are high enough to implement large and dense RRAM arrays. In a 10 nm size technology the drive current is preferably above 1 $MA/cm^2$ and the non-linearity factor is preferably above $10^3$. A non-linearity factor above $10^3$ has as advantage that it allows to make large memory arrays.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
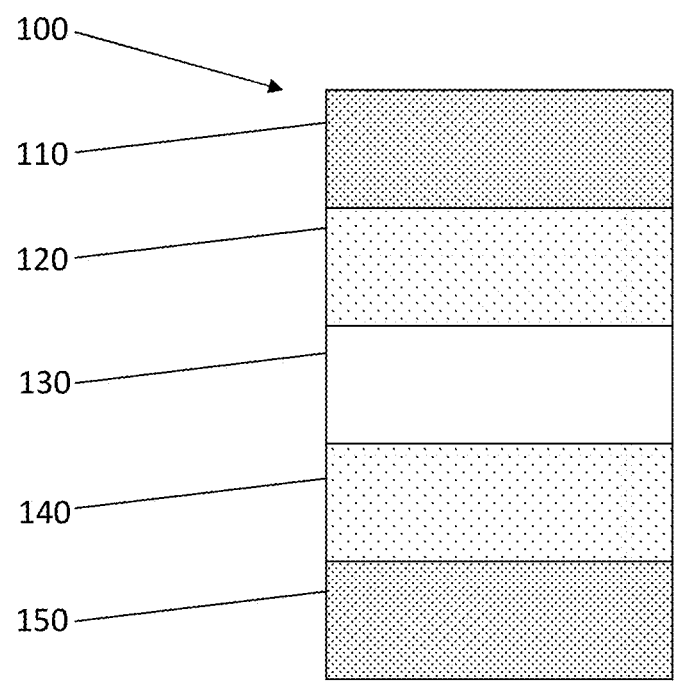
FIG. 1 provides a schematic view of a metal/semiconductor/ insulator/semiconductor/metal selector structure in accordance with embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "non-linearity factor of the selector", reference is made to the ratio of the current at the voltage where the target drive current is achieved to the current at half of that voltage. Alternative wording for "non-linearity factor of the selector" is "the rectification factor of the selector", both having the same meaning.

Where in embodiments of the present disclosure reference is made to "a variable-barrier injector" reference is made to a metal/semiconductor or to a metal/dielectric interface comprising a metal and a semiconductor or low-bandgap dielectric of a few nm thick. The bandgap may be below 6 eV, preferably below 4 eV. In embodiments of the present disclosure the thickness of the semiconductor or low-bandgap dielectric is up to 10 nm, preferably below 6 nm, more preferably below 5 nm. The general features are that there is a small metalsemiconductor (low bandgap dielectric) potential energy barrier, which can offer high-enough drive current and this barrier changes with bias. This potential energy barrier, also referred to as electron barrier height may be below 1.5 eV, and preferably between 0.4 eV and 1 eV In a first aspect, the present invention relates to a system 100 applicable as a selector for resistance switching memory cells, for instance in large and/or dense RRAM arrays. In embodiments of the present disclosure, the RRAM arrays comprise a plurality of resistance switching memory cells logically organized in a matrix structure with connections on rows and columns. The terms "horizontal" and "vertical" (related to the terms "row" and "column", respectively) may be used to provide a co-ordinate system. They do not need to, but may, refer to actual physical direction of the device. Furthermore, the terms "column" and "row" are used to describe sets of array elements which are linked together. The linking can be in the form of a Cartesian array of rows and columns; however, the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, reference is made here to "logically organized in rows and columns". By this is meant that sets of memory elements are linked together in a topologically linear intersecting manner; however, that the physical or topographical arrangement need not be so. For example, the rows may be circles and the columns radii of these circles and the circles and radii are described in this invention as "logically organized" rows and columns.

According to embodiments of the present disclosure, as illustrated in FIG. 1, a selector device 100 comprises a first metal/semiconductor structure comprising a first metal 110 and a first semiconductor 120, and a second metal/semiconductor structure comprising a second metal 150 and a second semiconductor 140. In some embodiments, instead of a semiconductor material, a dielectric material with a low bandgap may be used for the first semiconductor 120 and the second semiconductor 140. When used, the dielectric material with a low bandgap may be chosen to have a bandgap below 6 eV, preferably below 4 eV, for instance a bandgap between 1 eV and 4 eV. The structure may have a metal/semiconductor or low-bandgap dielectric electron barrier height below 2 eV, and preferably between 0.4 eV and 1 eV. Such low barrier height can be achieved with a semiconductor/low bandgap dielectric.

The first and second metal/semiconductor (low bandgap dielectric) structures are positioned such that the first and second semiconductors (low bandgap dielectrics) 120, 140 face one another. The system 100 furthermore comprises an insulator 130 interposed between the first semiconductor (low bandgap dielectric) 120 and the second semiconductor (low bandgap dielectric) 140. The first metal 110/semiconductor (low bandgap dielectric) 120 structure and the second metal 150/semiconductor (low bandgap dielectric) 140 structure are thus oriented back to back. In various embodiments, of the present disclosure, materials of the first metal 110/semiconductor (low bandgap dielectric) 120 structure can be either different or the same compared to the second metal 150 semiconductor (low bandgap dielectric) 140 structure. In the illustrated embodiment, the metal 110 contacts the first semiconductor 120, the first semiconductor contacts the insulator 130, the insulator 130 contacts the second semiconductor 140, and the second semiconductor 140 contacts the second metal 150.

It will be appreciated that in some embodiments, the first and second metal/semiconductor structures are interposed by the insulator 130 but there are no intervening metals, such that the selector device 100 has one of a metal/semiconductor/insulator/semiconductor/metal (M/S/I/S/M) configuration or a metal/low bandgap dielectric/insulator/low bandgap dielectric/metal (M/I/I/I/M) configuration.

In some embodiments, the first semiconductor or the first low bandgap dielectric material and the second semiconductor or the second low bandgap dielectric material are formed of the same material and have the same thickness such that the selector device is a symmetric device configured to pass substantially the same magnitude of current under the same bias magnitude in opposite polarities.

In embodiments of the present disclosure, the metal/semiconductor (low bandgap dielectric) interfaces in the first and second metal/semiconductor (low bandgap dielectric) structures are referred to as variable barrier injectors. It is an advantage of embodiments of the present disclosure that the variable barrier injectors can provide a high drive current, e.g., via tunneling current density of at least 1 MA/cm$^2$, when the semiconductor (or low bandgap dielectric) layer has a thickness not exceeding a few nm. It is an advantage of embodiments of the present disclosure that under sufficiently high bias condition, e.g., under a target cell selection bias, the selector device 100 predominantly passes carriers (e.g., electrons) though one of the injectors while passing little or no carriers though the middle insulator layer 130, thus delivering a high drive current. In contrast, under a relatively low bias condition, e.g., a deselected/inhibited bias, the selector device 100 passes a relatively low current because carriers (e.g., electrons) pass additionally through a substantial portion of the middle insulator layer 130.

In embodiments of the present disclosure, the semiconductor layer in the first and second metal/semiconductor structures can be formed of, e.g., amorphous silicon (a-Si). Other low bandgap dielectrics/semiconductors can also be used. Examples of semiconductors that may be used are: Si, Ge, SiGe, GaAs, InAs, AlAs, InGaAs, AlGaAs, AlSb, GaSb, AlGaSb, InP, GaP, AlP, AlGaP, ZnSe, CdSe, CdTe, CdS, in either amorphous or polycrystalline form, including their possible alloys. Examples of low-bandgap dielectrics that may be used are: Ta$_2$O$_5$, SiC (including different polymorphs such as 3C, 4H, 6H, etc.), Cu$_2$O, TiO$_2$, SrTiO$_3$, BaO, SrO, VO$_2$, V$_2$O$_3$, NiO, Ga$_2$O$_3$, In$_2$O$_3$, SnO, Sn$_2$O$_3$, SnO$_2$, GaN, GaInZnO, InGaN, AlGaN, ZnO, CdO. Using amorphous silicon for realizing a selector according to embodiments of the present disclosure has the advantages that it is CMOS friendly, that it is compatible with typical back end of the line (BEOL) processes, that only a low thermal budget is required, and that it is commonly available. Since a-Si deposition is a PVD process that takes place at room temperature, no thermal budget constraints are added in the process. If, following the deposition of a-Si, a predetermined thermal budget is needed, this will only improve the material characteristics of a-Si.

In embodiments of the present invention the metal in the first metal/semiconductor (low bandgap dielectric) structure and/or the metal in the second metal/semiconductor (low bandgap dielectric) structure may be formed of a metallic compound such as TiN or TiAlN. It is an advantage of embodiments of the present disclosure where metallic compounds are used that the metal/ semiconductor (M/S) barrier height can be controlled through workfunction modification. In embodiments of the present disclosure the M/S interface barrier is controlled by Al %, for instance a higher Al content decreases the workfunction and therefore the M/S barrier, between that of TiN and that of Al. Other possible metals that can be used are e.g., W, Ru, Ti, Ta, Mg, etc. M/S barrier height may be controlled through alternative methods such as local doping of the semiconductor (or low-bandgap dielectric) material, such as, for instance, Mg-doping of TiO$_2$. In some embodiments, neither of first metalsemiconductor (low bandgap dielectric) structure nor the second metalsemiconductor (low bandgap dielectric) structure includes a noble metal, e.g., Pt.

The selector device according to embodiments of the present disclosure has an insulator with a mid to low bandgap (e.g. between 2 eV and 6 eV, for instance between 2 and 5 eV). Furthermore the insulator has an additional barrier height in the conduction band (e.g., the difference between the barrier heights 570 and 560 in FIG. 5) compared to that shown by the semiconductor (or low bandgap dielectric) larger than 0.2 eV, and preferably between 0.4 eV and 1.0 eV. Such insulator can typically be implemented in an oxide such as e.g. Ta$_2$O$_5$, AlTaO$_x$, TaSiO$_x$, or, Si$_3$N$_4$, nitrogen (N)-doped silicon, Si-rich SiN (Si$_3$N$_{4-x}$, where x<4), standard high-k dielectrics such as, e.g., HfO$_2$ or rare earth oxides. It can also be any of the low bandgap dielectrics that can substitute the semiconductor, such as SiC (different polymorphs, 3C, 4H, 6H), Cu$_2$O, TiO$_2$, SrTiO$_3$, BaO, SrO, VO$_2$, V$_2$O$_3$, NiO, Ga$_2$O$_3$, In$_2$O$_3$, SnO, Sn$_2$O$_3$, SnO$_2$, GaN, InGaN, AlGaN, ZnO, CdO, suitably selected such that the potential energy barrier (electron barrier height) of the insulator exceeds that of the semiconductor (low-bandgap dielectric). It is an advantage of embodiments of the present disclosure that the whole stack can be processed in a Si-based process. When, in embodiments of the present disclosure, nitrogen (N) is introduced into the Si, this will increase the bandgap. It is an advantage of embodiments of the present invention that a similar potential barrier profile can be created by introducing N in the Si. This might be done in a single process (in-situ), by changing deposition parameters to introduce N. Furthermore, it is an advantage that such an insulator layer may be deposited through for example a CVD-type of process.

In embodiments of the present invention the insulator may be a stack of thin dielectrics. The number of layers in the stack may vary between 1 and 5, preferably between 1 and 3. The thickness of the dielectric layers in the stack may vary between 1 monolayer and 10 nm, preferably between 1 monolayer and 5 nm. It is advantageous to have an insulator stack comprising additional outer layers for meeting specific functions. In embodiments of the present disclosure the insulator consists of a stack comprising a main barrier oxide and additional outer layers at one or, preferably, at either side thereof. It is an advantage of embodiments of the present disclosure that the additional outer layers may be selected for enhancing the deposition and/or growth of the main barrier oxide. It is an advantage of embodiments of the present disclosure that the insulator provides an enhanced non-linearity factor for the selector function. A non-linearity factor of at least 1000 is possible. The thickness of the insulator and the additional semiconductor/insulator electron barrier height are the main control factors for tuning the non-linearity factor.

It is an advantage of embodiments of the present disclosure that a particular selection of materials may be made such that materials of the whole potential barrier profile can be formed using Si-based materials, which may provide manufacturing advantages. For instance, the selector system 100 could be made from a TiN/a-Si/Si-rich SiN/a-Si/TiN stack, a TiAlN/a-Si/Si-rich SiN/a-Si/TiAlN stack, a TiN/a-Si/N-doped Si/a-Si/TiN stack, a TiAlN/a-Si/N-doped Si/a-Si/TiAlN stack, or another similar stack where all layers are based on Si, or Si-containing material.

Exemplary embodiments of the present disclosure are validated through combined experimental and simulation results.

Figure 2:
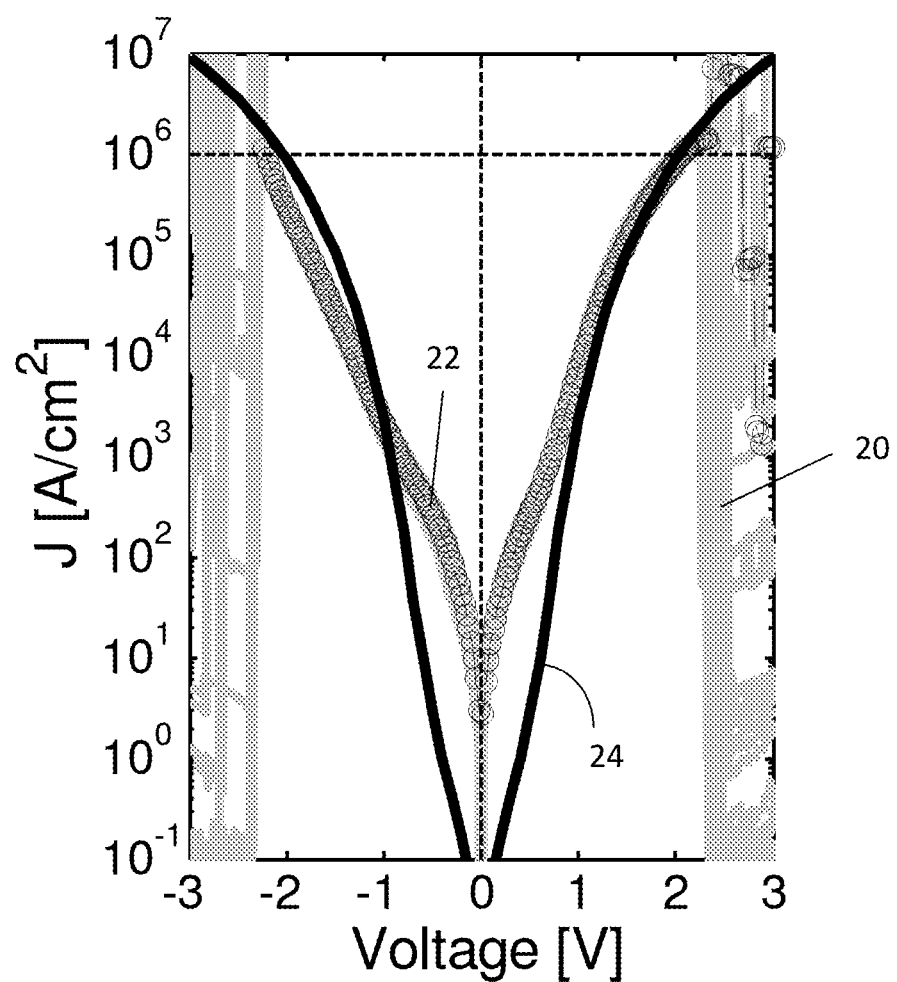
FIG. 2 illustrates current density versus applied voltage for a Metal/Semiconductor/Metal structure. Measured data as well as simulated data are shown.

FIG. 2 illustrates current density versus applied voltage (J-V) curves for a selector device having a stacked TiN/amorphous silicon/TiN structure, where fabricated cell sizes were as small as 40×40 nm², with 8 nm thick deposited amorphous silicon. The raw data 20, the averaged data 22, as well as the simulation data 24 are shown. The back-to-back amorphous silicon double Schottky diode has a good, high enough, drive current; however, the non-linearity factor is only about 320. The simulations 24 were performed using a modified version of the model published by B. Govoreanu et al. in Solid-St. Electronics, vol 47(6): 1045-1054, 2003. The simulation in the example of FIG. 2 was calibrated based on the measurement results of the aforementioned structure. The calibrated simulation parameters are used in simulations of exemplary embodiments of the present invention. These simulation results are shown in FIG. 4.

Figure 3:
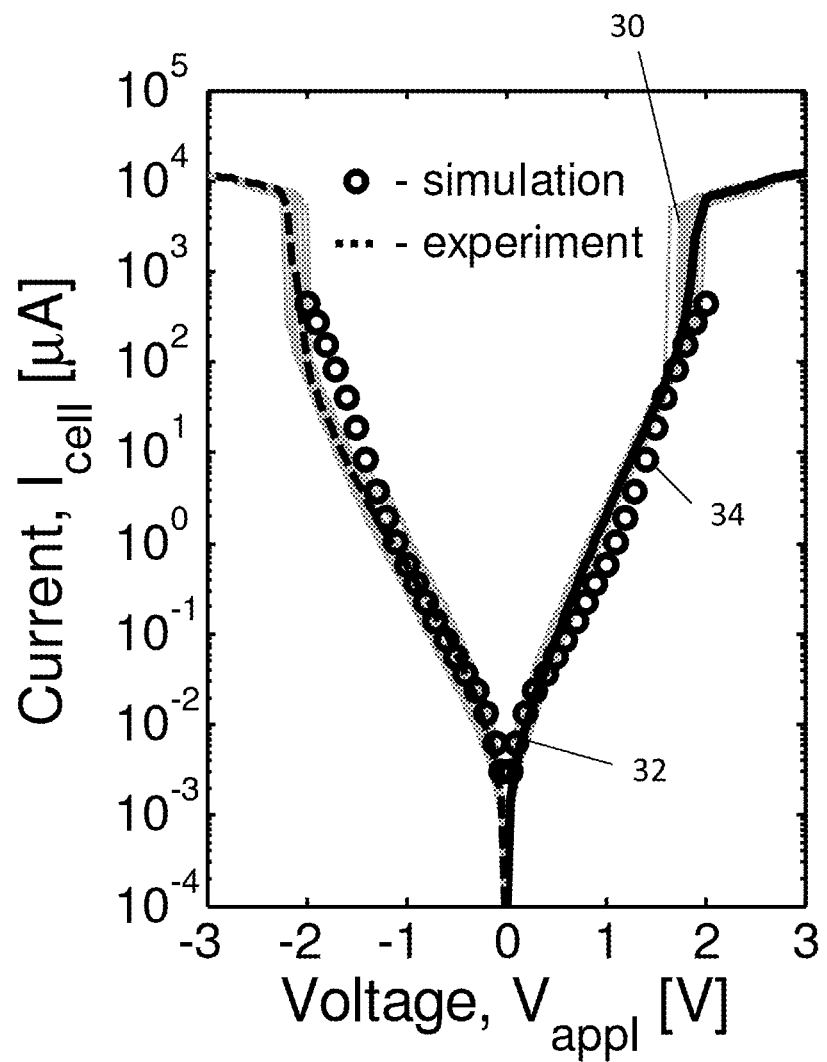
FIG. 3 illustrates current versus applied voltage for a Metal/Insulator/Metal (e.g. a Metal/Oxide/Metal) structure. Measured data as well as simulated data are shown.

FIG. 3 illustrates current versus applied voltage (I-V) curves for a selector device having a stacked TiN/Ta$_2$O$_5$/TiN structure. Raw data 30, averaged data 32, as well as simulation data 34 are shown. The parameters extracted by calibrating simulations to experimental data are used to assess the potential of the novel concept proposed in the present invention. Oxide based single-layer tunnel diodes can provide a high non-linearity factor, however drive current is an issue. The cell area in the embodiment corresponding with FIG. 3 is 1 µm². The density achievable with such metal/insulator/metal diodes is about 1×10$^5$ A/cm² and is limited by the breakdown voltage (which increases with decreasing area).

Figure 4:
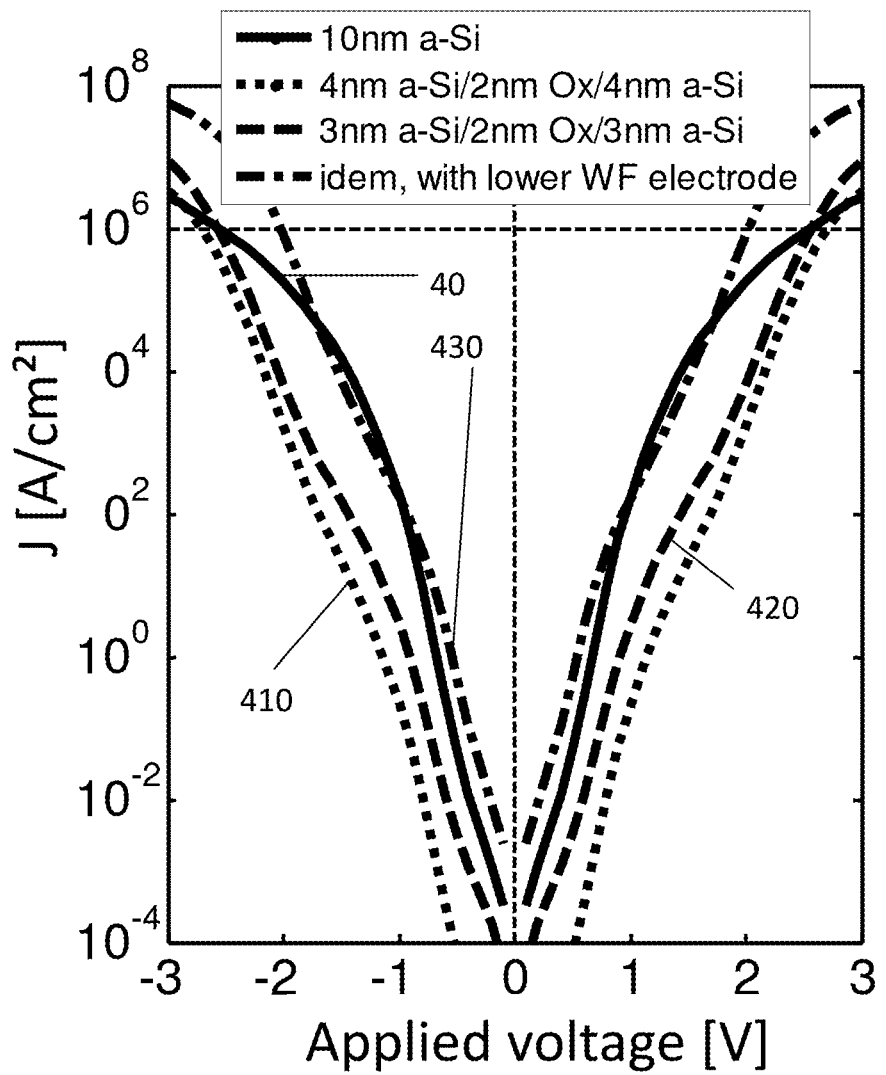
FIG. 4 illustrates current density versus applied voltage. The simulated data for a Metal/Semiconductor/Metal as well as the simulated data for Metal/Semiconductor/Insulator/Semiconductor/Metal structures, according to embodiments of the present disclosure, are shown.

FIG. 4 illustrates current density versus applied voltage (J-V) curves for various selector devices according to embodiments of the present disclosure. Without being bound to any theory, simulated J-V curves of different structures are shown. As a reference, simulation curve 40 for a TiN/amorphous silicon/TiN reference structure with 10 nm deposited amorphous silicon is shown. A parameter in the simulations that can heavily influence the calculated current density is the metalsemiconductor barrier height. Under some circumstances, barriers having different metals with the same metalsemiconductor barrier heights that are placed under the same bias can have the same current density.

The other lines are:
(1) The simulated relationship 410 between current density and applied voltage for a 4 nm amorphous silicon/2 nm Oxide/4 nm amorphous silicon structure. The structure has the same physical thickness (10 nm) as the amorphous silicon layer in the reference structure, but in accordance with embodiments of the present invention, a buffer oxide is inserted in the middle of the amorphous silicon layer.
(2) The simulated relationship 420 between current density and applied voltage for a structure similar as the structure above under (1) but wherein thinner Si-injectors are used. In the simulated structure the thickness of the Si-injectors is reduced from 4 nm to 3 nm. The non-linearity can be estimated from the simulated relationship:

$$NL_{420} \sim \frac{Current(V_{target})}{Current\left(\frac{V_{target}}{2}\right)} = \frac{1.3 \times 10^6}{40} \sim 3.2 \times 10^4$$

whereby $V_{target}$ equals 2.6V.

(3) The simulated relationship 430 between current density and applied voltage for a structure similar to the structure above but whereby the Metal/Semiconductor interface is changed by 0.2 eV towards n-type, illustrating an extremely effective way to tailor the current-voltage characteristics of the concept. The non-linearity, whereby $V_{target}$ equals 2.1V, can be estimated from the simulated relationship:

$$NL_{430} \sim \frac{Current(V_{target})}{Current\left(\frac{V_{target}}{2}\right)} = \frac{1.9 \times 10^6}{260} \sim 7320$$

The non-linearity, whereby $V_{target}$ equals 2.4V, can be estimated from the simulated relationship:

$$NL_{430} \sim \frac{Current(V_{target})}{Current\left(\frac{V_{target}}{2}\right)} = \frac{1.12 \times 10^7}{724.4} \sim 1.55 \times 10^4$$

It is an advantage of embodiments of the present disclosure that both a high drive current as well as a high nonlinearity can be obtained. For an exemplary embodiment of the present disclosure these values can be derived from the graphs in FIG. 4.

The non-linearity factor of the reference structure can be estimated from FIG. 4. At a target current level of 1 MA/cm² the voltage for the reference structure is 2.6 V. At half the voltage (1.3V) the simulated current level is 3100 A/cm². Therefore the estimated non-linearity factor equals:

$$NL_{Ref} \sim \frac{Current(V_{target})}{Current\left(\frac{V_{target}}{2}\right)} = \frac{10^6}{3100} \sim 320$$

whereby $V_{target}$ equals 2.6 V.

The non-linearity factor of a structure conform an embodiment of the present disclosure where the 10 nm amorphous silicon layer of the reference structure is replaced by a 4 nm amorphous silicon/2 nm oxide/4 nm amorphous silicon structure, at similar current drive (1.6 MA/cm²) can be estimated based on the graph corresponding with this structure and shown in FIG. 4 simulated relationship 410:

$$NL_{410} \sim \frac{Current(V_{target})}{Current\left(\frac{V_{target}}{2}\right)} = \frac{1.6 \times 10^6}{10.7} \sim 1.5 \times 10^5$$

whereby $V_{target}$ equals 2.8 V. Therefore the baseline improvement factor, i.e. the ratio of non-linearities of the novel structure versus the reference structure, equals:

$$\text{Improvement factor} = \frac{1.5 \times 10^5}{320} \sim 450$$

The non-linearity factor of the novel selector structure, calculated here through simulations, is exceeding the required non-linearity factor of 1000 largely. Indeed an improvement factor of 10 compared to the reference structure would already be more than sufficient for several RRAM arrays. Hence a large margin is present to account for the difference between the simulations and a practical implementation. It is an advantage of embodiments of the present disclosure that the non-linearity factor improvement can be tuned in several ways as illustrated in FIG. 4. Tuning of the oxide thickness and of the workfunction are both illustrated in FIG. 4.

In exemplary embodiments of the present disclosure the oxide thickness is between an atomic layer (monolayer) and 10 nm, preferably between 2 monolayers and 5 nm. The semiconductor layer thickness is between a few monolayers and 10 nm, preferably between 2 nm and 8 nm. The metal layer thickness is between a few nm and a sufficiently large thickness to withstand current transport when operating the RRAM cell preferably between 10 and 100 nm.

In a second aspect, systems according to embodiments of the first aspect of the present disclosure are used as a selector for RRAM cells. In an exemplary embodiment of the present disclosure the selector can be applied for (two-terminal) RRAM cells in a one selector - one resistor memory cell architecture. It is an advantage of embodiments of the present disclosure that a high drive current as well as a high nonlinearity for the selector can be achieved. This allows for implementation of large and dense RRAM arrays. It is an advantage of embodiments of the present disclosure that integrable CMOS materials may be used to form an appropriate selector for an RRAM array.

Embodiments of the present disclosure enable 3D RRAM by multi-stacked cross-point arrays. It is an advantage of embodiments of the present disclosure that the selector has the ability to limit the leakage of the bit/word line selected cells. It is an advantage of embodiments of the present disclosure that the selector fits into the crossbar pitch. Furthermore it is an advantage that large currents are enabled as they provide the ability for setreset switching of the RRAM cell. It is an advantage of embodiments of the present disclosure that a higher current density enables higher cell scalability. For example, in case a switching resistive element can be operated with a set current of 0.7 μA and a reset current of 0.8 μA, the current requirement is: $I_{SR}$=0.8 μA (the higher of the two). Assuming the maximal current drive of the selector is $J_{max}$, then the scalability of the selector is defined by the minimum feature size.

$$F_{min} = \sqrt{\frac{I_{SR}}{J_{max}}}$$

For the example above, if the maximum current density Jmax equals 1×106 A/cm2, the minimum feature size equals:

$$F_{min} = \sqrt{\frac{I_{SR}}{J_{max}}} = \sqrt{\frac{0.8e-6}{1e6}} \cong 9 \text{ nm}$$

Figure 5:
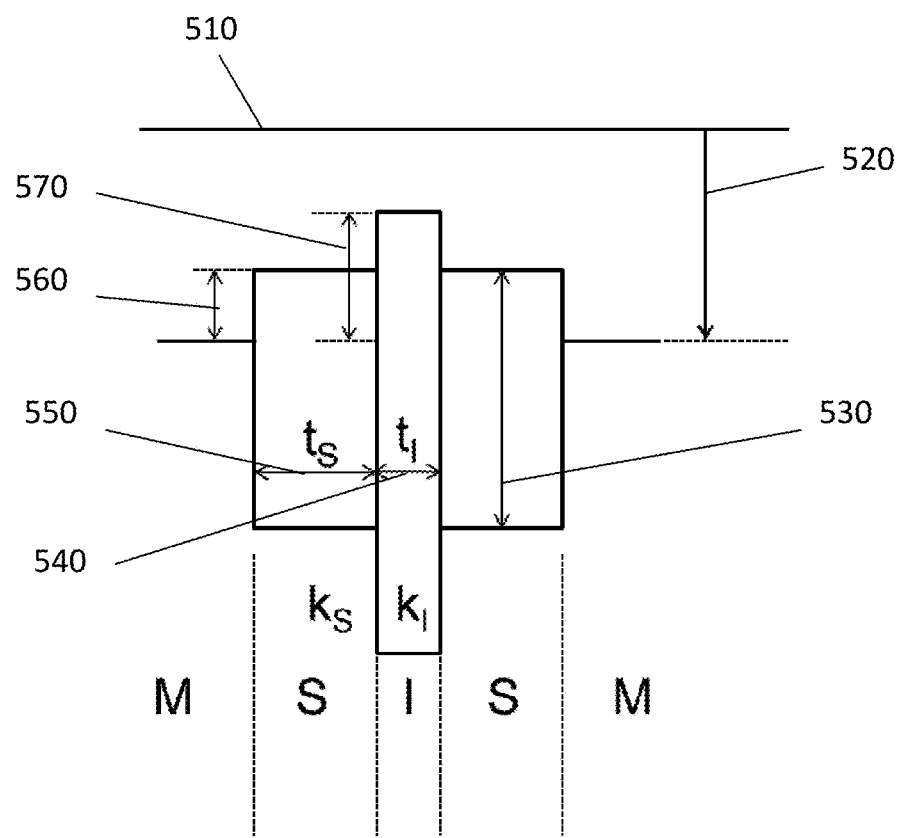
FIG. 5 is a schematic view of the band diagram at no applied bias when the metalsemiconductor structure is identical on both sides of the insulator in accordance with embodiments of the present invention.

The energy bands diagram of a first metal 110/semiconductor 120/insulator 130/semiconductor 140/metal 150 structure according to embodiments of the present invention are illustrated in FIG. 5.

The metal workfunction 520 can be modified with respect to the vacuum level 510 according to embodiments of the present disclosure. In embodiments of the present disclosure the insulator material is preferably chosen such that the conduction band offset of the insulator relative to the metal, also denoted as $\phi_B(I)$ 520, is:

$$\Phi_B(I) \leq \frac{q \cdot V_{max}}{2 + \frac{k_S}{k_I}}$$

wherein $V_{max}$ is the preferred voltage at which the drive current should be achieved and wherein $k_S$, and $k_I$ are the dielectric constants of the semiconductor and insulator, respectively. In an exemplary embodiment of the present disclosure $k_S$=10 and $k_I$=20. With $V_{max}$=3V the conduction band offset of the insulator is preferably smaller than:

$$\Phi_B(I) \leq \frac{1e \cdot 3 \text{ V}}{2 + \frac{10}{20}} = 1.2 \text{ eV}$$

In embodiments of the present disclosure, to deliver high drive current, the thickness of the semiconductor $t_s$ 550, is preferably chosen such that:

$$\frac{\Phi_B(I)}{q \cdot t_S} \leq F_{max,S}$$

wherein $F_{max,S}$ is the breakdown field in the semiconductor material.

In an exemplary embodiment of the present disclosure, the breakdown field of the semiconductor $F_{max,S}$=4MV/cm. With $\Phi_B(I)$=1.2 eV this leads to:

$$t_S > \frac{1.2 \text{ eV}}{1e \times 4MV/\text{cm}} = 3 \text{ nm}$$

This is a practical minimum value below which the stack might not work due to breakdown issues, for the breakdown field considered for exemplification.

In embodiments of the present disclosure, the thickness of the insulator $t_I$ 540, may be chosen such that:

$$\frac{k_S \cdot \Phi_B(I)}{k_I \cdot t_I} \leq F_{max,I}$$

wherein $F_{max,I}$ is the breakdown field in the insulator material.

In an exemplary embodiment of the present disclosure the breakdown field of the insulator $F_{max,I}$=6 MV/cm. With $\Phi_B(I)$=1.2 eV this leads to:

$$t_l > \frac{10 \times 1.2 \text{ eV}}{1e \times 20 \times 6 MV/\text{cm}} = 2 \text{ nm}$$

This is a practical minimum value below which the stack might not work due to breakdown issues, for the breakdown field considered in this example.

In FIG. 5 also the conduction band offset of the semiconductor relative to the metal, denoted as $\phi_B(S)$ 560, is illustrated.

In these exemplary embodiments it are the band offsets (or barrier heights) rather than the bandgaps that are the relevant characteristics for calculating other parameters of the stack design.

In embodiments of the present disclosure the insulator material has a conduction band offset higher than that of the semiconductor (dielectric) material. Preferably the conduction band offset must not exceed 1 eV.

The foregoing description details certain embodiments of the invention. It will be appreciated, however, that no matter how detailed the foregoing appears in text, the invention may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

What is claimed is:

1. A selector device, comprising:
    a first barrier structure comprising a first metal contacting a first semiconductor or a first low bandgap dielectric material;
    a second barrier structure comprising a second metal contacting a second semiconductor or a second low bandgap dielectric material; and
    an insulator contacting each of and interposed between the first semiconductor or the first low bandgap dielectric material and the second semiconductor or the second low bandgap dielectric material,
    wherein the first barrier structure, the insulator, and the second barrier structure are stacked to form a metal/semiconductor or low bandgap dielectric/insulator/semiconductor or low bandgap dielectric/metal structure,
    wherein the insulator has a band gap that is between 2 eV and 6 eV, and wherein the insulator has a higher electron barrier height compared to an electron barrier height of each of the first semiconductor or the first low bandgap dielectric material and the second semiconductor or the second low bandgap dielectric material.

2. The selector device of claim 1, wherein at least one of the first metal and the second metal is a metallic compound.

3. The selector device of claim 1, wherein at least one of the first semiconductor or the first low bandgap dielectric material and the second semiconductor or the second low bandgap dielectric material has a band gap between 1 eV and 4 eV.

4. The selector device of claim 1, wherein at least one of the first semiconductor or the first low bandgap dielectric material and the second semiconductor or the second low bandgap dielectric material is formed of silicon.

5. The selector device of claim 1, wherein at least one of the first semiconductor or the first low bandgap dielectric material and the second semiconductor or the second low bandgap dielectric material is formed of amorphous silicon.

6. The selector device of claim 1, wherein the insulator comprises a stack of multiple dielectric materials.

7. The selector device of claim 1, wherein the insulator is formed of a Si-rich SiN layer or a nitrogen-doped Si layer.

8. The selector device of claim 1, wherein the barrier heights and thicknesses of the insulator, the first semiconductor or the first low bandgap dielectric material, and the second semiconductor or the second low bandgap dielectric material are such that the selector device tunnels a current density exceeding $1 \times 10^6$ A/cm$^2$.

9. The selector device of claim 8, wherein the insulator has a conduction band energy level that is higher than a conduction band energy level of at least one of the first semiconductor or the first low bandgap dielectric material and the second semiconductor or the second low bandgap dielectric material by at least 0.2 eV.

10. The selector device of claim 1, wherein at least one of the first metal and the second metal is TiN, wherein at least one of the first semiconductor or the first low bandgap dielectric material and the second semiconductor or the second low bandgap dielectric material is formed of amorphous silicon, and wherein the insulator is formed of one of $Ta_2O_5$, $AlTaO_x$ or $TaSiO_x$.

11. The selector device of claim 1, wherein the first metal and the second metal are formed of the same material, and wherein the first semiconductor or the first low bandgap dielectric material and the second semiconductor or the second low bandgap dielectric material are formed of the same material.

12. The selector device of claim 11, wherein the first semiconductor or the first low bandgap dielectric material and the second semiconductor or the second low bandgap dielectric material have the same thickness such that the selector device is a symmetric device configured to pass substantially the same magnitude of current under the same bias magnitude under opposite polarities.

13. The selector device of claim 10, wherein each of the first semiconductor or the first low bandgap dielectric material and the second semiconductor or the second low bandgap dielectric material is a layer of amorphous silicon.

14. The selector device of claim 13, wherein the insulator has a thickness between an atomic monolayer thickness of the insulator and 10 nm.

15. The selector device of claim 14, wherein each of the first semiconductor or the first low bandgap dielectric material and the second semiconductor or the second low bandgap dielectric material provides the electron barrier height between 0.4 eV and 1 eV.

16. The selector device of claim 15, wherein the layer of amorphous silicon has a thickness between 2 nm and 10 nm such that, when biased, a nonlinearity factor defined as ratio between a current density at a target voltage and a current density at half the target voltage exceeds 1000.

17. A selector device, comprising:
    a first semiconductor or a first low bandgap dielectric material contacting a first metal and having a first electron barrier height relative to the first metal;
    a second semiconductor or a second low bandgap dielectric material contacting a second metal and having a second electron barrier relative to the second metal; and
    an oxide contacting each of and interposed between the first semiconductor or the first low bandgap dielectric material and the second semiconductor or the second low bandgap dielectric material,
    wherein the oxide has a band gap that is between 2 eV and 6 eV, a third electron barrier height relative to the first metal that is higher than the first barrier height by at least 0.2 eV and a fourth electron barrier height relative to the second metal that is higher than the second barrier height by at least 0.2 eV, and wherein each of the first semiconductor or the first low bandgap dielectric material, the second semiconductor or a second low bandgap dielectric material and the oxide has a thickness between an atomic monolayer thickness of the respective material and 10 nm, and wherein the selector is configured to flow current when biased such that a ratio between current a target voltage and current at half the target voltage exceeds 1000.

18. The selector device of claim 17, wherein one or both of the first metal and the second metal is TiN, wherein one or both of the first semiconductor or the first low bandgap dielectric material and the second semiconductor or the second low bandgap dielectric material is formed of amorphous silicon, and wherein the oxide is formed of one of $Ta_2O_5$, $AlTaO_x$ or $TaSiO_x$.

* * * * *

UNITED STATES PATENT AND TRADEMARK OFFICE
CERTIFICATE OF CORRECTION

PATENT NO. : 9,786,795 B2
APPLICATION NO. : 14/508906
DATED : October 10, 2017
INVENTOR(S) : Bogdan Govoreanu It is certified that error appears in the above-identified patent and that said Letters Patent is hereby corrected as shown below:

In the Specification

Column 2 Line 42, Change "metalsemiconductor" to --metal/semiconductor--.

Column 3 Lines 1-2, Change "metalsemiconductor" to --metal/semiconductor--.

Column 3 Line 7, Change "metalsemiconductor" to --metal/semiconductor--.

Column 3 Line 17, Change "metalsemiconductor" to --metal/semiconductor--.

Column 3 Line 58, Change "metalsemiconductor" to --metal/semiconductor--.

Column 3 Line 60, Change "metalsemiconductor" to --metal/semiconductor--.

Column 4 Line 39, Change "metalsemiconductor" to --metal/semiconductor--.

Column 6 Line 5, Change "metalsemiconductor" to --metal/semiconductor--.

Column 6 Line 9, Change "eV" to --eV.--.

Column 6 Line 67, Change "150 semiconductor" to --150/semiconductor--.

Column 8 Lines 11-12, Change "metalsemiconductor" to --metal/semiconductor--.

Column 8 Line 13, Change "metalsemiconductor" to --metal/semiconductor--.

Column 9 Line 5, Change "TiNstack," to --TiN stack,--.

Column 9 Line 48, Change "metalsemiconductor" to --metal/semiconductor--.

Signed and Sealed this
Seventeenth Day of April, 2018

Andrei Iancu
*Director of the United States Patent and Trademark Office*

CERTIFICATE OF CORRECTION (continued)
U.S. Pat. No. 9,786,795 B2

Column 9 Line 50, Change "metalsemiconductor" to --metal/semiconductor--.

Column 11 Line 45, Change "setreset" to --set/reset--.

In the Claims

Column 15 Line 10, Claim 17, change "a" to --at--.